US012740347B2

(12) United States Patent
Takahashi et al.

(10) Patent No.: US 12,740,347 B2
(45) Date of Patent: Sep. 15, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Masahiro Takahashi, Toyama (JP); Hideki Horita, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 758 days.

(21) Appl. No.: 18/070,072

(22) Filed: Nov. 28, 2022

(65) Prior Publication Data

US 2023/0098703 A1 Mar. 30, 2023

Related U.S. Application Data

(63) Continuation of application No. PCT/JP2021/019395, filed on May 21, 2021.

(30) Foreign Application Priority Data

May 29, 2020 (JP) ................................ 2020-094304

(51) Int. Cl.
*H10P 14/20* (2026.01)
*H10P 14/24* (2026.01)

(52) U.S. Cl.
CPC .......... *H10P 14/3411* (2026.01); *H10P 14/24* (2026.01); *H10P 14/3211* (2026.01);
(Continued)

(58) Field of Classification Search
CPC .................... H01L 21/02422; H01L 21/02532
See application file for complete search history.

(56) References Cited

U.S. PATENT DOCUMENTS 9,859,401 B2 * 1/2018 Yamazaki ......... H01L 21/02472
2005/0093085 A1 5/2005 Sudo
(Continued)

FOREIGN PATENT DOCUMENTS

CN 1469489 A 1/2004
CN 102345115 A 2/2012
(Continued)

OTHER PUBLICATIONS

Taiwan Office Action issued on Jun. 20, 2023 for Taiwan Patent Application No. 110118362.
(Continued)

*Primary Examiner* — Dah-Wei D. Yuan
*Assistant Examiner* — Andrew J Bowman
(74) *Attorney, Agent, or Firm* — Volpe Koenig

(57) ABSTRACT

There is included (a) forming a chlorine-containing semiconductor layer on an insulating film provided on a surface of a substrate by supplying a first gas containing a semiconductor element and chlorine to the substrate; and (b) forming a semiconductor film on the chlorine-containing semiconductor layer by supplying a second gas containing a semiconductor element to the substrate, wherein a chlorine concentration in the chlorine-containing semiconductor layer formed in (a) is made $1.0\times10^{20}$ atoms/cm$^3$ or more and $1.0\times10^{22}$ atoms/cm$^3$ or less.

17 Claims, 5 Drawing Sheets

(52) U.S. Cl.
CPC ...... *H10P 14/3238* (2026.01); *H10P 14/3246* (2026.01); *H10P 14/3802* (2026.01)

(56) References Cited

U.S. PATENT DOCUMENTS

| | | | |
|---|---|---|---|
| 2012/0021570 | A1 | 1/2012 | Tajima et al. |
| 2012/0077330 | A1 | 3/2012 | Noda |
| 2014/0256156 | A1 | 9/2014 | Harada et al. |
| 2015/0255269 | A1 | 9/2015 | Harada et al. |

FOREIGN PATENT DOCUMENTS

| | | | |
|---|---|---|---|
| JP | 11-26385 | A | 1/1999 |
| JP | 2001-352087 | A | 12/2001 |
| JP | 2004-022575 | A | 1/2004 |
| JP | 2012-049517 | A | 3/2012 |
| JP | 2013-093452 | A | 5/2013 |
| JP | 2013-197307 | A | 9/2013 |
| JP | 2014-175320 | A | 9/2014 |
| JP | 2015-142078 | A | 8/2015 |
| KR | 10-2012-0022568 | A | 3/2012 |
| KR | 10-2014-0109288 | A | 9/2014 |

OTHER PUBLICATIONS

Japanese Office Action issued on Jun. 27, 2023 for Japanese Patent Application No. 2022-526993.

Singapore Written Opinion issued on Jul. 18, 2025 for Singapore Patent Application No. 11202260682Q.

International Search Report with English Translation, PCT/JP2021/019395, Aug. 10, 2021, 5 pgs.

Taiwan Office Action for Application No. 110118352 with English Translation, 14 pages.

Korean Office Action issued on Mar. 4, 2024 for Korean Patent Application No. 10-2022-7041669.

Chinese Office Action issued on Dec. 15, 2025 for Chinese Application No. 202180037257.2.

* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is a Bypass Continuation Application of PCT International Application No. PCT/JP2021/019395, filed on May 21, 2021, the international application being based upon and claiming the benefit of priority from Japanese Patent Application No. 2020-094304, filed on May 29, 2020, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

In the related art, as one process of manufacturing a semiconductor device, a process of forming a semiconductor film on an insulating film provided on a surface of a substrate may be performed.

SUMMARY

Some embodiments of the present disclosure provide a technique capable of improving the characteristics of a semiconductor device.

According to one embodiment of the present disclosure, there is provided a technique that includes (a) forming a chlorine-containing semiconductor layer on an insulating film provided on a surface of a substrate by supplying a first gas containing a semiconductor element and chlorine to the substrate; and (b) forming a semiconductor film on the chlorine-containing semiconductor layer by supplying a second gas containing a semiconductor element to the substrate, wherein a chlorine concentration in the chlorine-containing semiconductor layer formed in (a) is made $1.0\times10^{20}$ atoms/cm$^3$ or more and $1.0\times10^{22}$ atoms/cm$^3$ or less.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Hereinafter, embodiments of the present disclosure will be described mainly with reference to FIGS. 1 to 4. The drawings used in the following description are all schematic. The dimensional relationship of each element, the ratio of each element, and the like on the drawings do not always match the actual ones. Further, even between the drawings, the dimensional relationship of each element, the ratio of each element, and the like do not always match.

(1) Configuration of Substrate Processing Apparatus

Figure 1:
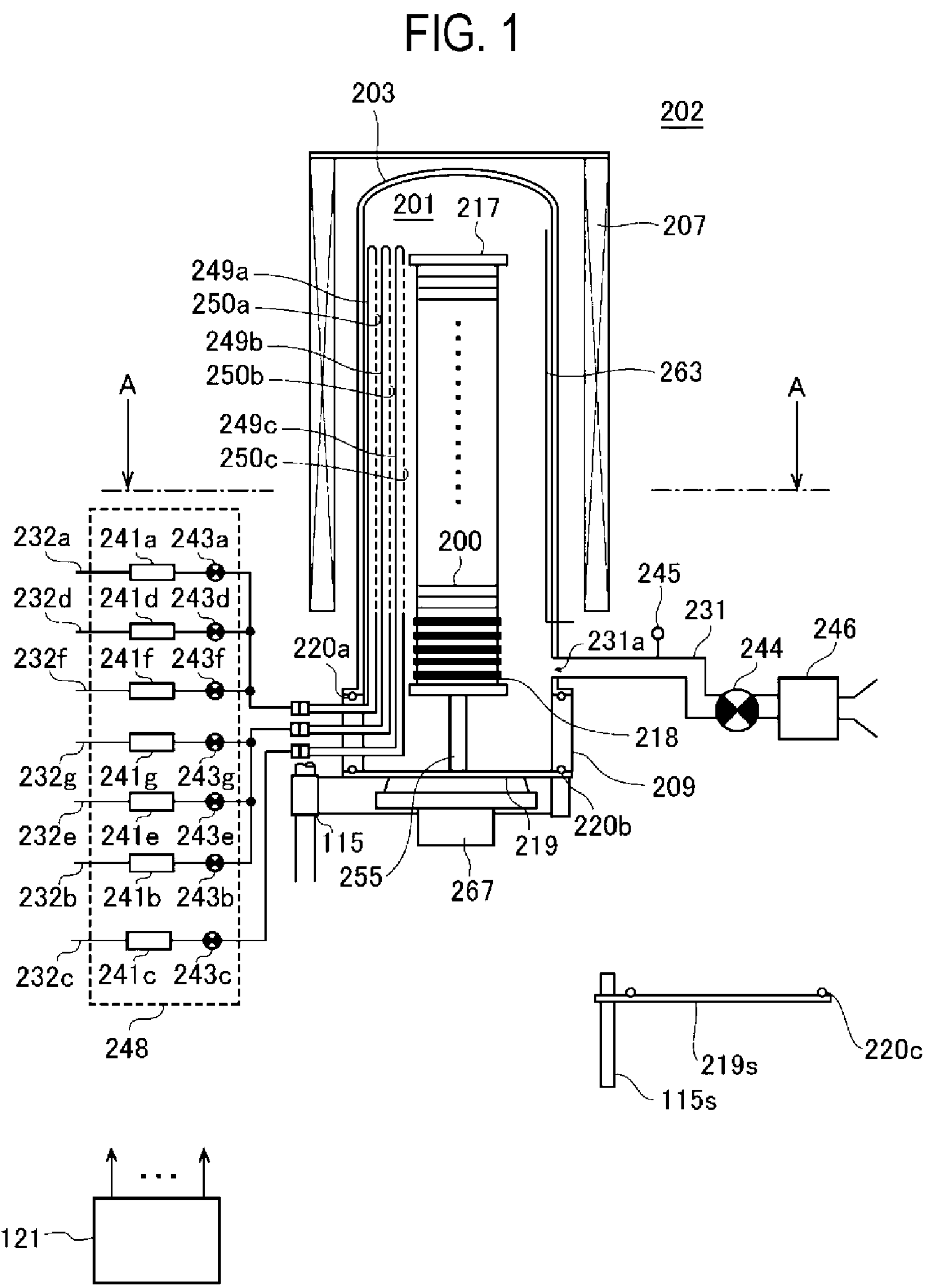
FIG. 1 is a schematic configuration diagram of a vertical process furnace of a substrate processing apparatus suitably used in embodiments of the present disclosure, in which the portion of the process furnace is illustrated in a vertical cross-sectional view.

As shown in FIG. 1, a process furnace 202 includes a heater 207 as a heating mechanism (temperature adjustment part). The heater 207 has a cylindrical shape and is vertically installed by being supported by a holding plate. The heater 207 also functions as an activation mechanism (excitation part) that activates (excites) a gas with heat.

Inside the heater 207, a reaction tube 203 is arranged concentrically with the heater 207. The reaction tube 203 is made of a heat-resistant material such as, for example, quartz ($SiO_2$) or silicon carbide (SiC) and is formed in a cylindrical shape with an upper end thereof closed and a lower end thereof opened. Below the reaction tube 203, a manifold 209 is arranged concentrically with the reaction tube 203. The manifold 209 is made of a metallic material such as stainless steel (SUS) or the like and is formed in a cylindrical shape with upper and lower ends thereof opened. The upper end of the manifold 209 is engaged with the lower end of the reaction tube 203 and is configured to support the reaction tube 203. An O-ring **220*a* as a seal member is installed between the manifold 209 and the reaction tube 203. The reaction tube 203 is installed vertically just like the heater 207. A process container (reaction container) is mainly composed of the reaction tube 203 and the manifold 209. A process chamber 201 is formed in the hollow portion of the process container. The process chamber 201 is configured to accommodate wafers 200 as substrates. The wafers 200 are processed in the process chamber 201**.

Nozzles **249*a* to 249*c* as first to third suppliers are installed in the process chamber 201 so as to penetrate through a side wall of the manifold 209. The nozzles 249*a* to 249*c* are also referred to as first to third nozzles, respectively. The nozzles 249*a* to 249*c* are made of, for example, a non-metal material which is a heat-resistant material such as quartz or SiC. Gas supply pipes 232***a* to 232*c* are connected to the nozzles 249*a* to 249*c*, respectively. The nozzles 249*a* to 249*c* are different nozzles, and the nozzles 249*a* and 249*c* are installed adjacent to the nozzle 249*b*.

Mass flow controllers (MFCs) 241*a* to 241*c*, which are flow rate controllers (flow control parts), and valves 243*a* to 243*c*, which are opening/closing valves, are installed in the gas supply pipes 232*a* to 232*c*, respectively, sequentially from the upstream side of a gas flow. Gas supply pipes 232*d* and 232*f* are connected to the gas supply pipe 232*a* at the downstream side of the valve 243*a*. Gas supply pipes 232*e* and 232*g* are connected to the gas supply pipe 232*b* at the downstream side of the valve 243*b*. MFCs 241*d* to 241*g* and valves 243*d* to 243*g* are installed in the gas supply pipes 232*d* to 232*g*, respectively, sequentially from the upstream side of a gas flow. The gas supply pipes 232*a* to 232*g* are made of, for example, a metal material such as stainless steel or the like.

Figure 2:
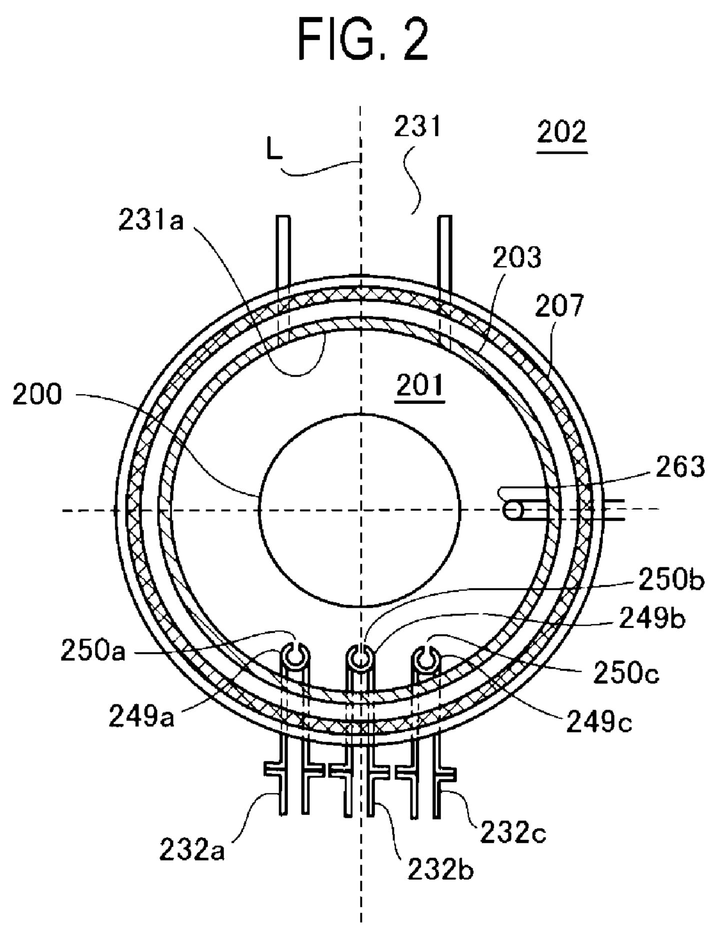
FIG. 2 is a schematic configuration diagram of the vertical process furnace of the substrate processing apparatus suitably used in embodiments of the present disclosure, in which the portion of the process furnace is illustrated in a cross-sectional view taken along line A-A in FIG. 1.

As shown in FIG. 2, the nozzles 249*a* to 249*c* are arranged in a space having an annular shape in a plan view between the inner wall of the reaction tube 203 and the wafers 200 so as to extend upward from a lower portion of the inner wall of the reaction tube 203 to an upper portion of the inner wall of the reaction tube 203, that is, along an arrangement direction of the wafers 200. In other words, the nozzles 249*a* to 249*c* are respectively installed in a region horizontally surrounding a wafer arrangement region in which the wafers 200 are arranged at a lateral side of the wafer arrangement region, along the wafer arrangement region. In a plan view, the nozzle 249*b* is arranged so as to face an exhaust port 231*a* to be described later in a straight line with the centers of the wafers 200 loaded into the process chamber 201, which are interposed therebetween. The nozzles 249*a* and 249*c* are arranged so as to sandwich a straight line L passing through the nozzle 249*b* and the center of the exhaust port 231*a* from both sides along the inner wall of the reaction tube 203 (the outer peripheral portions of the wafers 200). The straight line L is also a straight line passing through the nozzle 249*b* and the centers of the wafers 200. That is, it can be said that the nozzle 249*c* is installed on the side opposite to the nozzle 249*a* with the straight line L interposed therebetween. The nozzles 249*a* and 249*c* are arranged line-symmetrically with the straight line L as an axis of symmetry. Gas supply holes 250*a* to 250*c* for supplying gases are formed on the side surfaces of the nozzles 249*a* to 249*c*, respectively. The gas supply holes 250*a* to 250*c* are respectively opened so as to oppose (face) the exhaust port 231*a* in a plan view, which enables a gas to be supplied toward the wafers 200. A plurality of gas supply holes 250*a* to 250*c* is formed from the lower portion of the reaction tube 203 to the upper portion of the reaction tube 203.

From the gas supply pipe 232*a*, as a first gas, for example, a gas containing silicon (Si) as a semiconductor element constituting a film to be formed on the wafer 200 and chlorine (Cl), that is, a chlorosilane-based gas is supplied into the process chamber 201 via the MFC 241*a*, the valve 243*a*, and the nozzle 249*a*. The chlorosilane-based gas contains a chemical bond between Si and Cl (Si—Cl bond).

From the gas supply pipe 232*b*, as a second gas, for example, a gas containing Si as a semiconductor element, that is, a silane-based gas is supplied into the process chamber 201 via the MFC 241*b*, the valve 243*b*, and the nozzle 249*b*.

From the gas supply pipe 232*d*, as a third gas, for example, a gas containing Si as semiconductor elements and hydrogen (H), that is, a silicon hydride gas is supplied into the process chamber 201 via the MFC 241*d*, the valve 243*d*, the gas supply pipe 232*a*, and the nozzle 249*a*.

From the gas supply pipe 232*e*, as a fourth gas, for example, an H-containing gas is supplied into the process chamber 201 via the MFC 241*e*, the valve 243*e*, the gas supply pipe 232*b*, and the nozzle 249*b*.

From gas supply pipes 232*c*, 232*f* and 232*g*, an inert gas is supplied into the process chamber 201 via the MFCs 241*c*, 241*f* and 241*g*, the valves 243*c*, 243*f* and 243*g*, the gas supply pipes 232*a* to 232*c*, and the nozzles 249*a* to 249*c*, respectively. The inert gas acts as a purge gas, a carrier gas, a dilution gas, or the like.

A first gas supply system mainly includes the gas supply pipe 232*a*, the MFC 241*a* and the valve 243*a*. A second gas supply system mainly includes the gas supply pipe 232*b*, the MFC 241*b* and the valve 243*b*. A third gas supply system mainly includes the gas supply pipe 232*d*, the MFC 241*d* and the valve 243*d*. A fourth gas supply system mainly includes the gas supply pipe 232*e*, the MFC 241*e* and the valve 243*e*. An inert gas supply system mainly includes the gas supply pipes 232*c*, 232*f* and 232*g*, the MFCs 241*c*, 241*f* and 241*g*, and the valves 243*c*, 243*f* and 243*g*.

One or all of the above-described gas supply systems may be configured as an integrated-type gas supply system 248 in which the valves 243*a* to 243*g*, the MFCs 241*a* to 241*g* and the like are integrated. The integrated-type gas supply system 248 is connected to each of the gas supply pipes 232*a* to 232*g* and is configured such that operations of supplying various gases into the gas supply pipes 232*a* to 232*g*, that is, the opening/closing operation of the valves 243*a* to 243*g*, the flow rate adjusting operation by the MFCs 241*a* to 241*g*, and the like are controlled by a controller 121 which will be described later. The integrated-type gas supply system 248 is configured as an integral type or detachable-type integrated unit and may be attached to and detached from the gas supply pipes 232*a* to 232*g* on an integrated unit basis, so that the maintenance, replacement, extension, and the like of the integrated-type gas supply system 248 can be performed on an integrated unit basis.

The exhaust port 231*a* for exhausting the atmosphere in the process chamber 201 is installed in the lower portion of the side wall of the reaction tube 203. As shown in FIG. 2, the exhaust port 231*a* is installed at a position opposing (facing) the nozzles 249*a* to 249*c* (gas supply holes 250*a* to 250*c*) with the wafers 200 interposed therebetween in a plan view. The exhaust port 231*a* may be installed from the lower portion to the upper portion of the side wall of the reaction tube 203, that is, along the wafer arrangement region. An exhaust pipe 231 is connected to the exhaust port 231*a*. A vacuum pump 246 as a vacuum exhaust device is connected to the exhaust pipe 231 via a pressure sensor 245, which is a pressure detector (pressure detection part) for detecting the pressure inside the process chamber 201, and an APC (Auto Pressure Controller) valve 244, which is a pressure regulator (pressure regulation part). The APC valve 244 is configured to perform or stop a vacuum exhausting operation in the process chamber 201 by opening/closing the valve in a state in which the vacuum pump 246 is actuated, and is also configured to regulate the internal pressure of the process chamber 201 by adjusting an opening degree of the valve based on the pressure information detected by the pressure sensor 245 in a state in which the vacuum pump 246 is actuated. An exhaust system mainly includes the exhaust pipe 231, the APC valve 244, and the pressure sensor 245. The vacuum pump 246 may be included in the exhaust system.

A seal cap 219, which serves as a furnace opening cover configured to be capable of airtightly sealing a lower end opening of the manifold 209, is installed below the manifold 209. The seal cap 219 is made of a metallic material such as, for example, stainless steel or the like, and is formed in a disc shape. On an upper surface of the seal cap 219, an O-ring 220*b*, which is a seal member making contact with the lower end of the manifold 209, is installed. Below the seal cap 219, a rotator 267 configured to rotate a boat 217, which will be described later, is installed. A rotary shaft 255 of the rotator 267 is connected to the boat 217 through the seal cap 219. The rotator 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer device (transfer mechanism) that loads and unloads (transfers) the wafers 200 into and out of the process chamber 201 by moving the seal cap 219 up and down.

Below the manifold 209, a shutter 219*s* is installed as a furnace opening cover configure to be capable of airtightly sealing the lower end opening of the manifold 209 in a state in which the seal cap 219 is lowered and the boat 217 is unloaded from the process chamber 201. The shutter 219*s* is made of a metal material such as stainless steel or the like and is formed in a disc shape. An O-ring 220*c*, which is a seal member making contact with the lower end of the manifold 209, is installed on an upper surface of the shutter 219*s*. The opening/closing operations (the elevating operation, the rotating operation, and the like) of the shutter 219*s* are controlled by a shutter opener/closer 115*s*.

A boat 217 serving as a substrate support is configured so as to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat-resistant material such as, for example, quartz or SiC. Heat insulating plates 218 made of a heat-resistant material such as, for example, quartz or SiC, are supported in multiple stages at the bottom of the boat 217.

Inside the reaction tube 203, a temperature sensor 263 serving as a temperature detector is installed. By adjusting a state of supplying electric power to the heater 207 based on the temperature information detected by the temperature sensor 263, the temperature inside the process chamber 201 becomes a desired temperature distribution. The temperature sensor 263 is installed along the inner wall of the reaction tube 203.

Figure 3:
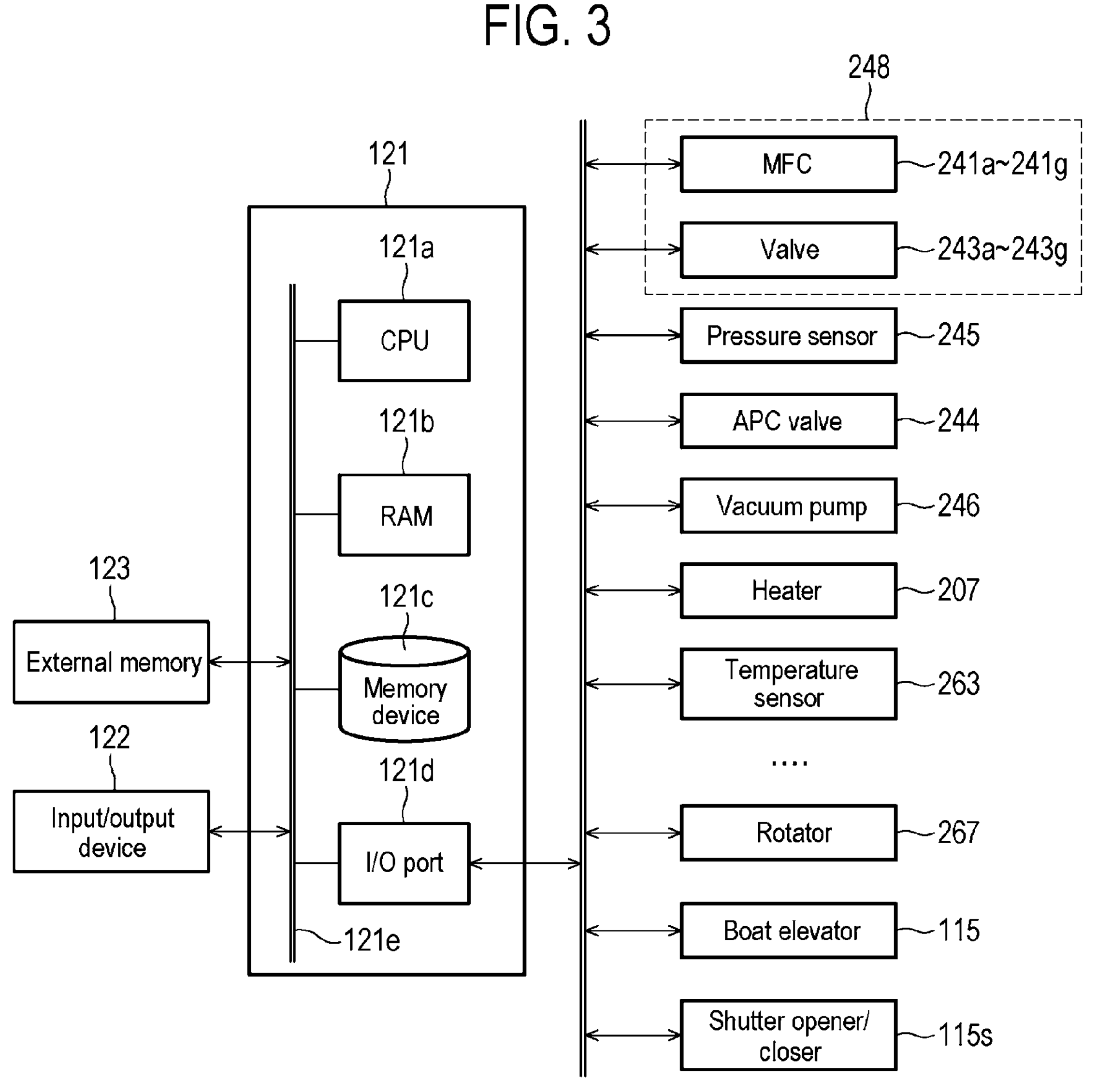
FIG. 3 is a schematic configuration diagram of a controller of the substrate processing apparatus suitably used in embodiments of the present disclosure, in which a control system of the controller is illustrated in a block diagram.

As shown in FIG. 3, the controller 121 as a control part (control means) is configured as a computer including a CPU (Central Processing Unit) 121*a*, a RAM (Random Access Memory) 121*b*, a memory device 121*c* and an I/O port 121*d*. The RAM 121*b*, the memory device 121*c* and the I/O port 121*d* are configured to exchange data with the CPU 121*a* via an internal bus 121*e*. An input/output device 122 configured as, for example, a touch panel or the like is connected to the controller 121. In addition, an external memory device 123 can be connected to the controller 121.

The memory device 121*c* is composed of, for example, a flash memory, an HDD (Hard Disk Drive), an SSD (Solid State Drive), or the like. In the memory device 121*c*, a control program for controlling the operation of the substrate processing apparatus, a process recipe in which procedures and conditions of substrate processing to be described later are written, and the like are readably stored. The process recipe is a combination that causes the controller 121 to execute the respective procedures in a below-described substrate processing process so as to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may mean a case of including only the recipe, a case of including only the control program, or a case of including both the recipe and the control program. The RAM 121*b* is configured as a memory area (work area) in which programs, data and the like read by the CPU 121*a* are temporarily stored.

The I/O port 121*d* is connected to the MFCs 241*a* to 241*g*, the valves 243*a* to 243*g*, the pressure sensor 245, the APC valve 244, the vacuum pump 246, the temperature sensor 263, the heater 207, the rotator 267, the boat elevator 115, the shutter opener/closer 115*s*, and the like.

The CPU 121*a* is configured to read and execute the control program from the memory device 121*c* and to read the recipe from the memory device 121*c* in response to an input of an operation command from the input/output device 122 or the like. The CPU 121*a* is configured to, according to the contents of the recipe thus read, control the flow rate adjustment operation for various gases by the MFCs 241*a* to 241*g*, the opening/closing operations of the valves 243*a* to 243*g*, the opening/closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and the rotation speed adjustment operation of the boat 217 by the rotator 267, the operation of moving the boat 217 up and down by the boat elevator 115, the opening/closing operation of the shutter 219*s* by the shutter opener/closer 115*s*, and the like.

The controller 121 may be configured by installing, on the computer, the above-described program stored in an external memory device 123. The external memory device 123 includes, for example, a magnetic disk such as an HDD or the like, an optical disk such as a CD or the like, a magneto-optical disk such as an MO or the like, a semiconductor memory such as a USB memory, an SSD, or the like, and so forth. The memory device 121*c* and the external memory device 123 are configured as a computer readable recording medium. Hereinafter, the memory device 121*c* and the external memory device 123 are collectively and simply referred to as a recording medium. As used herein, the term "recording medium" may include only the memory device 121*c*, only the external memory device 123, or both. The provision of the program to the computer may be performed by using a communication means such as the Internet or a dedicated line without having to use the external memory device 123.

(2) Substrate Processing Process

An example of a substrate processing sequence in which a semiconductor film is formed by the above-described substrate processing apparatus on an insulating film provided on the surface of a wafer 200 as a substrate will be described as one process of manufacturing a semiconductor device mainly with reference to FIG. 4. In the following description, the operation of each part of the substrate processing apparatus is controlled by the controller 121.

Figure 4:
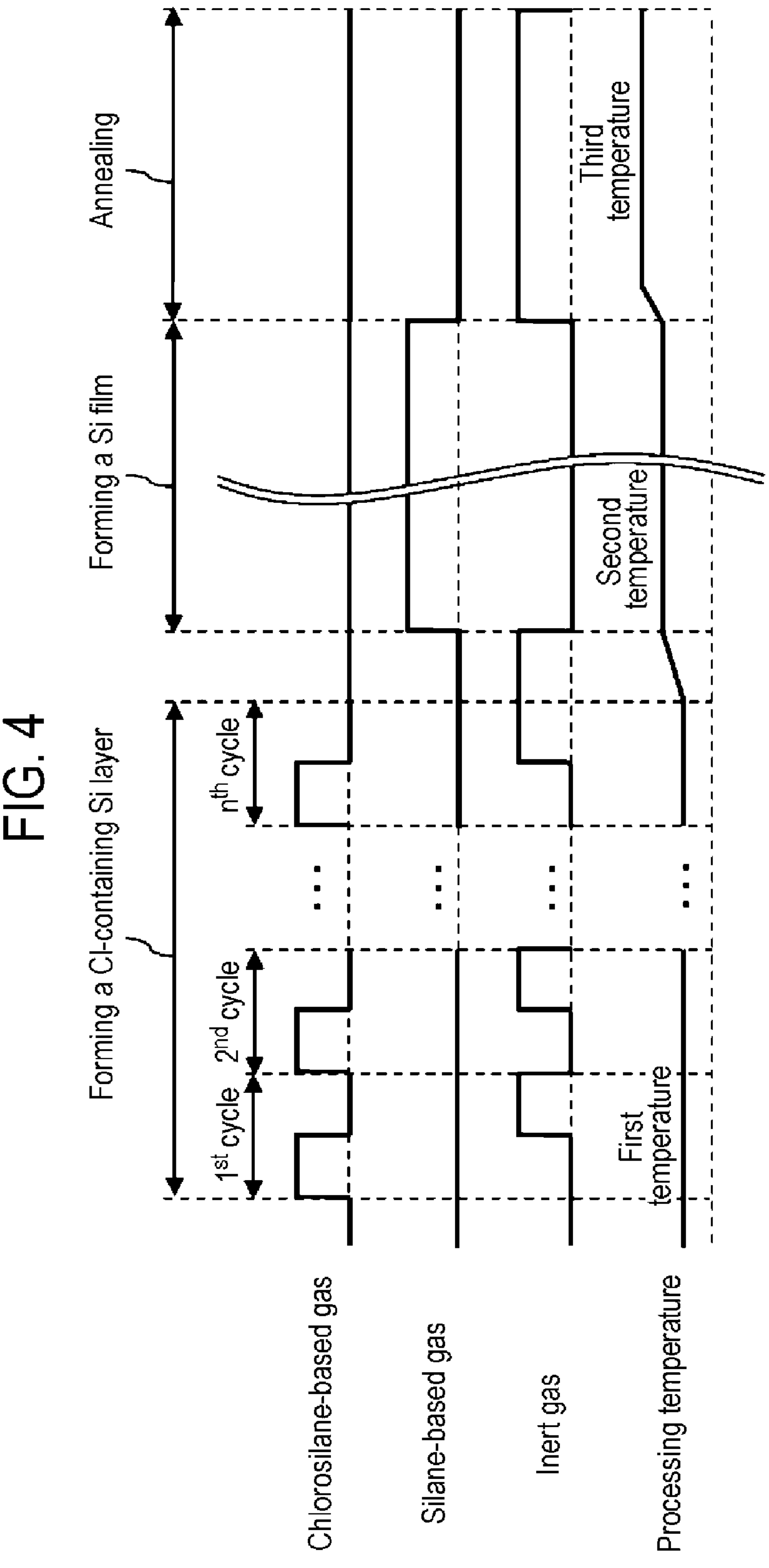
FIG. 4 is a diagram illustrating a substrate processing sequence according to embodiments of the present disclosure.

As shown in FIG. 4, a substrate processing sequence according to the present embodiment includes:

step A (Cl-containing Si layer-forming step) of forming a Cl-containing Si layer as a chlorine-containing semiconductor layer on a silicon oxide film (SiO film) as an insulating film provided on the surface of the wafer 200 by supplying a chlorosilane-based gas as a first gas to the wafer 200; and step B (Si film-forming step) of forming a silicon film (Si film) as a semiconductor film on the Cl-containing Si layer by supplying a silane-based gas as a second gas to the wafer 200, wherein a Cl concentration in the Cl-containing Si layer formed in step A is made $1.0\times10^{20}$ atoms/$cm^3$ or more and $1.0\times10^{22}$ atoms/$cm^3$ or less.

In step A, a cycle is performed a predetermined number of times (n times where n is an integer of 1 or more), the cycle including non-simultaneously performs: step A1 of supplying the chlorosilane-based gas to the wafer 200; and step A2 of purging a space where the wafer 200 exists with an inert gas to remove the chlorosilane-based gas remaining in the space.

The substrate processing sequence according to the present embodiment further includes:

step C (annealing step) of annealing the Cl-containing Si layer and the Si film after performing step B.

In this specification, for the sake of convenience, the substrate processing sequence described above may be denoted as follows. The same denotation is used also in the following description of modifications and the like. In addition, "ANL" denoted below represents annealing.

(Chlorosilane-based gas→inert gas)×*n*→silane-based gas→*ANL*

The term "wafer" used herein may refer to "a wafer itself" or "a wafer and a stacked body of certain layers or films formed on a surface of the wafer." The phrase "a surface of a wafer" used herein may refer to "a surface of a wafer itself" or "a surface of a certain layer or the like formed on a wafer." The expression "a certain layer is formed on a wafer" used herein may mean that "a certain layer is formed directly on a surface of a wafer itself" or that "a certain layer is formed on a layer or the like formed on a wafer." The term "substrate" used herein may be synonymous with the term "wafer."

(Wafer Charging and Boat Loading)

After the boat 217 is charged with a plurality of wafers 200 (wafer charging), the shutter 219*s* is moved by the shutter opener/closer 115*s* to open the lower end opening of the manifold 209 (shutter opening). Thereafter, as shown in FIG. 1, the boat 217 supporting the plurality of wafers 200 is lifted up by the boat elevator 115 and loaded into the process chamber 201 (boat loading). In this state, the seal cap 219 seals the lower end of the manifold 209 via the O-ring 220*b*.

A SiO film as an insulating film is formed in advance on the surface of the wafer 200. The insulating film may be a silicon oxynitride film (SiON film). It is desirable that the insulating film is a film that does not substantially contain Cl, that is, a Cl-free film.

(Pressure Regulation and Temperature Adjustment)

The inside of the process chamber 201, that is, the space where the wafer 200 exists, is vacuum-exhausted (decompression-exhausted by the vacuum pump 246 to reach a desired pressure (degree of vacuum). At this time, the pressure inside the process chamber 201 is measured by the pressure sensor 245, and the APC valve 244 is feedback-controlled based on the measured pressure information. Furthermore, the wafer 200 in the process chamber 201 is heated by the heater 207 so as to have a desired processing temperature. At this time, the state of supplying electric power to the heater 207 is feedback-controlled based on the temperature information detected by the temperature sensor 263 so that the inside of the process chamber 201 has a desired temperature distribution. Moreover, the rotation of the wafer 200 by the rotator 267 is started. The exhaust of the process chamber 201 and the heating and rotation of the wafer 200 are continuously performed at least until the processing on the wafer 200 is completed.

(Step A: Cl-Containing Si Layer-Forming Step)

Thereafter, the following steps A1 and A2 are sequentially executed.

[Step A1]

In this step, a chlorosilane-based gas is supplied to the wafer 200 in the process chamber 201, that is, the SiO film provided on the surface of the wafer 200.

Specifically, the valve 243*a* is opened to allow the chlorosilane-based gas to flow into the gas supply pipe 232*a*. The flow rate of the chlorosilane-based gas is adjusted by the MFC 241*a*. The chlorosilane-based gas is supplied into the process chamber 201 through the nozzle 249*a* and exhausted through the exhaust port 231*a*. At this time, the chlorosilane-based gas is supplied to the wafer 200. At this time, the valves 243*c*, 243*f* and 243*g* may be opened to supply an inert gas into the process chamber 201 through the nozzles 249*a* to 249*c*.

By supplying the chlorosilane-based gas to the wafer 200 under a processing condition to be described later, Si contained in the chlorosilane-based gas can be adsorbed (deposited) on the SiO film provided on the surface of the wafer 200 in a state in which Cl is bonded to Si. That is, it is possible to chemisorb Si contained in the chlorosilane-based gas onto the SiO film while maintaining the chemical bond between Si and Cl (Si—Cl bond) without being cut.

[Step A2]

After a predetermined time has elapsed, the valve 243*a* is closed to stop the supply of the chlorosilane-based gas into the process chamber 201. Then, the inside of the process chamber 201 is vacuum-exhausted to remove the gas and the like remaining in the process chamber 201 from the inside of the process chamber 201 (purging). At this time, the valves 243*c*, 243*f*, and 243*g* are opened to supply an inert gas into the process chamber 201. The inert gas acts as a purge gas.

[Performing a Predetermined Number of Times]

By performing a cycle a predetermined number of times (n times where n is an integer of 1 or more), the cycle including alternately, that is, non-simultaneously without synchronization, performing the above-described steps A1 and A2, it is possible to form a silicon layer (Si layer) containing Cl at a high concentration, that is, a Cl-containing Si layer, on the SiO film provided on the surface of the wafer 200. The Cl-containing Si layer becomes a layer that constitutes an interface between the SiO film, which is an insulating film, and the Si film, which is a semiconductor film to be described later. The Cl-containing Si layer becomes an amorphous Si layer containing Cl.

The Cl concentration in the Cl-containing Si layer is made, for example, $1.0\times10^{20}$ atoms/$cm^3$ or more and $1.0\times10^{22}$ atoms/$cm^3$ or less, specifically $3.0\times10^{20}$ atoms/$cm^3$ or more and $5.0\times10^{21}$ atoms/$cm^3$ or less.

It is desirable that the thickness of the Cl-containing Si layer is made smaller than the thickness of each of the SiO film provided on the surface of the wafer 200 and the Si film to be described later. The thickness of the Cl-containing Si layer is made, for example, one monolayer (hereinafter referred to as ML) or more and 30 Å (3 nm) or less, specifically 2.5 Å (0.25 nm) or more and 30 Å (3 nm) or less, more specifically 3 Å (0.3 nm) or more and 20 Å (2 nm) or less. 1 ML means a monomolecular layer or a monoatomic layer.

The Cl concentration and thickness of the Cl-containing Si layer can be respectively controlled by one or more selected from the group of a processing temperature (temperature of the wafer 200), a processing pressure (pressure in the space where the wafer 200 exists), a supply flow rate of the chlorosilane-based gas, and the supply time of the chlorosilane-based gas in step A1. This makes it possible to control a dangling bond density at the interface between the SiO film, which is the insulating film, and the Si film, which is the semiconductor film to be described later.

Further, the Cl concentration and thickness of the Cl-containing Si layer can be respectively controlled by the number of times (n times) the above-mentioned cycles is performed in step A. This makes it possible to control the dangling bond density at the interface between the SiO film, which is the insulating film, and the Si film, which is the semiconductor film to be described later.

An example of a processing condition in step A1 is described as follows.

Chlorosilane-based gas supply flow rate: 0.1 to 1 slm
Chlorosilane-based gas supply time: 0.5 to 2 minutes
Processing temperature (first temperature): 350 to 450 degrees C., specifically 350 to 400 degrees C.
Processing pressure: 277 to 1,200 Pa (2 to 9 Torr), specifically 667 to 1,200 Pa (5 to 9 Torr)

An example of a processing condition in step A2 is described as follows.

Inert gas supply flow rate: 0.5 to 20 slm
Inert gas supply time: 10 to 30 seconds
Processing pressure: 1 to 30 Pa Other processing conditions may be the same as the processing conditions in step A1.

In this specification, the notation of a numerical range such as "350 to 450 degrees C." means that a lower limit value and an upper limit value are included in the range. Therefore, for example, "350 to 450 degrees C." means "350 degrees C. or more and 450 degrees C. or less". The same applies to other numerical ranges.

As the first gas (chlorosilane-based gas), for example, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas, or the like may be used. This point is the same for each step and modifications to be described later.

As the inert gas, in addition to a nitrogen ($N_2$) gas, a rare gas such as an argon (Ar) gas, a helium (He) gas, a neon (Ne) gas, a xenon (Xe) gas or the like may be used. This point is the same for each step and modifications to be described later.

(Temperature Raising)

After step A is completed, that is, after the formation of the Cl-containing Si layer on the SiO film is completed, the output of the heater 207 is adjusted to change the temperature inside the process chamber 201, that is, the temperature of the wafer 200 to a second temperature higher than the first temperature. When performing this step, the valves 243*c*, 243*f*, and 243*g* are opened to supply an inert gas into the process chamber 201 through the nozzles 249*a* to 249*c*. The inert gas is exhausted from the exhaust port 231*a* to purge the inside of the process chamber 201. After the temperature of the wafer 200 reaches the second temperature and becomes stable, step B, which will be described later, is started.

(Step B: Si Film-Forming Step)

After the temperature of the wafer 200 reaches the second temperature and becomes stable, a silane-based gas is supplied to the wafer 200 in the process chamber 201, that is, the Cl-containing Si layer formed on the wafer 200.

Specifically, the valve 243*b* is opened to allow a silane-based gas to flow into the gas supply pipe 232*b*. The flow rate of the silane-based gas is adjusted by the MFC 241*b*. The silane-based gas is supplied into the process chamber 201 through the nozzle 249*b* and exhausted from the exhaust port 231*a*. At this time, the silane-based gas is supplied to the wafer 200. At this time, the valves 243*c*, 243*f*, and 243*g* may be opened to supply an inert gas into the process chamber 201 through the nozzles 249*a* to 249*c*.

By supplying the silane-based gas to the wafer 200 under the processing condition to be described later, it is possible to form a Si film by decomposing the silane-based gas in a gas phase and adsorbing (depositing) Si on the surface of the wafer 200, that is, on the Cl-containing Si layer formed on the SiO film. By using the silane-based gas that does not contain Cl, as the second gas, the Si film formed on the wafer 200 can be made as a Cl-free film.

In step B, the Si film formed on the Cl-containing Si layer is a Si film of an amorphous state or a Si film of a mixed state of amorphous and polycrystalline. At this time, a part of the Cl-containing Si layer may become polycrystalline, and the Cl-containing Si layer may become a Cl-containing Si layer Cl of a mixed state of amorphous and polycrystalline.

After a predetermined time has elapsed, the valve 243*b* is closed to stop the supply of the silane-based gas into the process chamber 201. Then, the gas or the like remaining in the process chamber 201 is removed from the process chamber 201 by the same processing procedure and processing conditions as those used in step A2.

An example of a processing condition in step B will be described as follows.

Silane-based gas supply flow rate: 0.01 to 5 slm
Silane-based gas supply time: 1 to 300 minutes
Inert gas supply flow rate (each gas supply pipe): 0 to 20 slm
Processing temperature (second temperature): 450 to 550 degrees C.
Processing pressure: 30 to 400 Pa (1.5 to 3 Torr)

As the second gas (silane-based gas), for example, a silicon hydride gas such as a monosilane ($SiH_4$) gas, a disilane ($Si_2H_6$) gas, a trisilane ($Si_3H_8$) gas, a tetrasilane ($Si_4H_{10}$) gas, a pentasilane ($Si_5H_{12}$) gas, a hexasilane ($Si_6H_{14}$) gas, or the like, and an aminosilane-based gas such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, bis(tert-butylamino)silane ($SiH_2[NH(C_4H_9)]_2$, abbreviation: BTBAS) gas, or the like may be used. In consideration of suppressing impurities such as H, N and C from being contained in the Si film formed in step B, it is desirable to use an N- and C-free silicon hydride gas as the silane-based gas.

(Temperature Raising)

After step B is completed, that is, after the formation of the Si film on the Cl-containing Si layer is completed, the output of the heater 207 is adjusted to change the temperature inside the process chamber 201, that is, the temperature of the wafer 200 to a third temperature higher than the second temperature. When performing this step, the valves 243*c*, 243*f*, and 243*g* are opened to supply an inert gas into the process chamber 201 through the nozzles 249*a* to 249*c*. The inert gas is exhausted from the exhaust port 231*a* to purge the inside of the process chamber 201. After the temperature of the wafer 200 reaches the third temperature and becomes stable, step C, which will be described later, is started.

(Step C: Annealing)

After the temperature of the wafer 200 reaches the third temperature and becomes stable, a heat treatment (annealing) is performed on the wafer 200 in the process chamber 201, that is, on the Cl-containing Si layer and the Si film formed on the wafer 200. This makes it possible to crystallize (make polycrystalline) the Cl-containing Si layer and the Si film. That is, the Cl-containing Si layer and Si film, of which are an amorphous state or a mixed state of amorphous and polycrystalline, are crystallized, so that it can be changed into a Cl-containing Si layer and Si film of a polycrystalline state. This step may be performed while opening the valves 243*c*, 243*f* and 243*g* to supply the inert gas into the process chamber 201, or while closing the valves 243*c*, 243*f* and 243*g* to stop the supply of the inert gas into the process chamber 201.

An example of a processing condition in step C is described as follows.

Inert gas supply flow rate (each gas supply pipe): 0 to 20 slm

Processing temperature (third temperature): 550 to 1,000 degrees C., specifically 600 to 800 degrees C.

Processing pressure: 0.1 to 100,000 Pa

Processing time: 1 to 300 minutes (After-Purging and Atmospheric Pressure Restoration)

After step C is completed, that is, after the annealing is completed, an inert gas as a purge gas is supplied into the process chamber 201 from each of the nozzles 249*a* to 249*c* and exhausted from the exhaust port 231*a*. As a result, the inside of the process chamber 201 is purged so that gases remaining in the process chamber 201, reaction by-products, and the like are removed from the inside of the process chamber 201 (after-purging). Thereafter, the atmosphere in the process chamber 201 is replaced with an inert gas (inert gas replacement), and the pressure in the process chamber 201 is restored to the atmospheric pressure (atmospheric pressure restoration).

(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219*s* is moved and the lower end opening of the manifold 209 is sealed by the shutter 219*s* via the O-ring 220*c* (shutter closing). The processed wafers 200 are discharged out of the boat 217 after being unloaded from the reaction tube 203 (wafer discharging).

(3) Effects of the Present Embodiment

According to the present embodiment, one or more of the following effects may be obtained.

(a) By forming the Cl-containing Si layer at the interface between the SiO film as the insulating film and the Si film as the semiconductor film (hereinafter referred to as a Si/SiO interface), the dangling bonds at the Si/SiO interface are terminated with Cl and can be controlled in such a direction as to reduce the density thereof. As a result, it is possible to control the interface state density at the Si/SiO interface in a reducing direction, and to improve the electrical characteristics of the semiconductor device.

(b) By making the Cl concentration in the Cl-containing Si layer $1.0\times10^{20}$ atoms/cm$^3$ or more and $1.0\times10^{22}$ atoms/cm$^3$ or less, it is possible to appropriately enhance the above-described effects. Further, by making the Cl concentration in the Cl-containing Si layer $3.0\times10^{20}$ atoms/cm$^3$ or more and $5.0\times10^{21}$ atoms/cm$^3$ or less, it is possible to enhance the above-described effects more appropriately.

If the Cl concentration in the Cl-containing Si layer is less than $1.0\times10^{20}$ atoms/cm$^3$, the dangling bonds at the Si/SiO interface cannot be sufficiently terminated with Cl, and there may be a case that the interface state density cannot be sufficiently reduced. As a result, it may not be possible to improve the electrical characteristics of the semiconductor device. By making the Cl concentration in the Cl-containing Si layer $1.0\times10^{20}$ atoms/cm$^3$ or more, the dangling bonds at the Si/SiO interface can be sufficiently terminated with Cl, and the interface state density can be sufficiently reduced. This makes it possible to improve the electrical characteristics of the semiconductor device. By making the Cl concentration in the Cl-containing Si layer $3.0\times10^{20}$ atoms/cm$^3$ or more, it is possible to further enhance this effect.

When the Cl concentration in the Cl-containing Si layer is made higher than $1.0\times10^{22}$ atoms/cm$^3$, there may be cases that the Cl concentration becomes excessive with respect to the dangling bond density at the Si/SiO interface, Cl may cause carrier scattering, and the electrical characteristics of the semiconductor device may deteriorate. By making the Cl concentration in the Cl-containing Si layer $1.0\times10^{22}$ atoms/cm$^3$ or less, it is possible to suppress the Cl concentration from becoming excessive with respect to the dangling bond density at the Si/SiO interface, to suppress the occurrence of carrier scattering caused by Cl, and to suppress the deterioration of the electrical characteristics of the semiconductor device. By making the Cl concentration in the Cl-containing Si layer $5.0\times10^{21}$ atoms/cm$^3$ or less, it is possible to further enhance this effect.

(c) By making the thickness of the Cl-containing Si layer 1 ML or more and 30 Å or less, it is possible to appropriately enhance the above-described effects. By making the thickness of the Cl-containing Si layer 2.5 Å or more and 30 Å or less, it is possible to enhance the above-described effects more appropriately. By making the thickness of the Cl-containing Si layer 3 Å or more and 20 Å or less, it is possible to enhance the above-described effects even more appropriately.

When the thickness of the Cl-containing Si layer is made less than 1 ML, the Cl atoms added to the Si/SiO interface may be insufficient to terminate dangling bonds at the Si/SiO interface, and there may be a case that the interface state density cannot be reduced sufficiently. As a result, it may not be possible to improve the electrical characteristics of the semiconductor device. By making the thickness of the Cl-containing Si layer 1 ML or more, the Cl atoms added to the Si/SiO interface are sufficient to terminate dangling bonds at the Si/SiO interface. This makes it possible to sufficiently reduce the interface state density and to improve the electrical characteristics of the semiconductor device. This effect can be enhanced by making the thickness of the Cl-containing Si layer 2.5 Å or more. This effect can be further enhanced by making the thickness of the Cl-containing Si layer 3 Å or more.

When the thickness of the Cl-containing Si layer is made larger than 30 Å, Cl may be easily diffused into the Si film above the Cl-containing Si layer. Further, an amount of Cl at the Si/SiO interface may become excessive. These may cause the electrical characteristics of the semiconductor device to deteriorate. By making the thickness of the Cl-containing Si layer 30 Å or less, it is possible to suppress the diffusion of Cl into the Si film above the Cl-containing Si layer, to suppress the amount of Cl from becoming excessive at the Si/SiO interface, and to suppress the deterioration of the electrical characteristics of the semiconductor device. This effect can be enhanced by making the thickness of the Cl-containing Si layer 20 Å or less.

(d) Cl is introduced into the Si/SiO interface in the form of a Cl-containing Si layer, which makes it possible to add Cl only to the Si/SiO interface in a pinpoint manner (locally). As a result, it is possible to suppress Cl from being diffused or introduced into the Si film and the SiO film, and it is possible to suppress the deterioration of the film characteristics and the deterioration of the electrical characteristics due to the Cl introduction into these films.

(e) Cl is introduced into the Si/SiO interface in the form of a Cl-containing Si layer, which makes it possible to fix Cl to the Si/SiO interface. As a result, it is possible to suppress the diffusion of Cl from the Si/SiO interface to a film adjacent to this interface, and it is possible to maintain the uniformity of the Cl concentration at the Si/SiO interface.

(f) In forming the Cl-containing Si layer, it is possible to precisely control at least one selected from the group of the Cl concentration and the thickness of the Cl-containing Si layer by performing a cycle a predetermined number of times, the cycle including non-simultaneously performing steps A1 and A2. This makes it possible to precisely control at least one selected from the group of the Cl concentration and Cl amount at the Si/SiO interface.

(g) The above-described effects can be similarly obtained even when the various chlorosilane-based gases described above and the various inert gases described above are used in the formation of the Cl-containing Si layer, even when the various silane-based gases described above and the various inert gases described above are used in the formation of the Si film, and even when the various inert gases described above are used in the annealing.

(4) Modifications

The substrate processing sequence according to the present embodiment may be modified as in the modifications described below. These modifications may be combined arbitrarily. Unless otherwise specified, the processing procedures and processing conditions in each step of each modification may be the same as the processing procedures and processing conditions in each step of the processing sequence described above.

(Modification 1)

As in the substrate processing sequence denoted below, in step A, a cycle is performed a predetermined number of times (n times where n is an integer of 1 or more), the cycle including non-simultaneously performing: step A1 of supplying a chlorosilane-based gas as a first gas to the wafer 200; step A2 of removing the chlorosilane-based gas remaining in the space by purging a space where the wafer 200 exists with an inert gas, step A3 of supplying a silicon hydride gas as a third gas to the wafer 200; and step A4 of removing the silicon hydride gas remaining in the space by purging the space where the wafer 200 exists with the inert gas.

(Chlorosilane-based gas→inert gas→silicon hydride gas→inert gas)×*n*→silane-based gas→*ANL*

When performing step A3, the valve 243*d* is opened to allow the silicon hydride gas to flow into the gas supply pipe 232*d*. The flow rate of the silicon hydride gas is controlled by the MFC 241*d*. The silicon hydride gas is supplied into the process chamber 201 through the gas supply pipe 232*a* and the nozzle 249*a*, and exhausted from the exhaust port 231*a*. At this time, the silicon hydride gas is supplied to the wafer 200. At this time, the valves 243*c*, 243*f*, and 243*g* may be opened to supply the inert gas into the process chamber 201 through the nozzles 249*a* to 249*c*.

An example of a processing condition in step A3 is described as follows.

Silicon hydride gas supply flow rate: 0.1 to 1 slm
Silicon hydride gas supply time: 0.5 to 2 minutes Other processing conditions may be the same as the processing conditions in step A1. As the third gas (silicon hydride gas), the various silicon hydride gases exemplified above as the second gas may be used.

The processing procedure and processing condition in step A4 may be the same as those used in step A2.

This modification also provides the same effects as those of the above-described embodiment. Further, by performing steps A3 and A4 after steps A1 and A2 are performed, it is possible to control the Cl concentration in the Cl-containing Si layer so as to decrease.

(Modification 2)

As in the substrate processing sequence denoted below, in step A, a cycle may be performed a predetermined number of times (n times where n is an integer of 1 or more), the cycle including non-simultaneously performing: step A1 of supplying a chlorosilane-based gas as a first gas to the wafer 200; step A2 of removing the chlorosilane-based gas remaining in the space by purging the space where the wafer 200 exists with an inert gas; step A5 of supplying a H-containing gas as a fourth gas to the wafer 200; and step A6 of removing the H-containing gas remaining in the space by purging the space where the wafer 200 exists with the inert gas.

(Chlorosilane-based gas→inert gas→H-containing gas→inert gas)×*n*→silane-based gas→*ANL*

When performing step A5, the valve 243*e* is opened to allow the H-containing gas to flow into the gas supply pipe 232*e*. The flow rate of the H-containing gas is adjusted by the MFC 241*d*. The H-containing gas is supplied into the process chamber 201 through the gas supply pipe 232*b* and the nozzle 249*b*, and exhausted from the exhaust port 231*a*. At this time, the H-containing gas is supplied to the wafer 200. At this time, the valves 243*c*, 243*f*, and 243*g* may be opened to supply the inert gas into the process chamber 201 through the nozzles 249*a* to 249*c*.

An example of a processing condition in step A5 is described as follows.

H-containing gas supply flow rate: 2 to 10 slm
H-containing gas supply time: 2 to 5 minutes
Processing pressure: 1,333 to 13,332 Pa (10 to 100 Torr)

Other processing conditions may be the same as the processing conditions used in step A1. For example, a hydrogen ($H_2$) gas may be used as the H-containing gas.

The processing procedure and processing conditions in step A6 may be the same as those used in step A2.

This modification also provides the same effects as those of the above-described embodiment. In addition, by performing step A5 after steps A1 and A2 are performed, it is possible to control the Cl concentration in the Cl-containing Si layer so as to decrease.

Other Embodiments of the Present Disclosure

The embodiments of the present disclosure have been specifically described above. However, the present disclosure is not limited to the embodiments described above, and various modifications may be made without departing from the scope of the present disclosure.

In the above-described embodiments, there has been described the case where the annealing is performed after forming the Si film. However, as in the substrate processing sequences denoted below, annealing may not be performed after forming the Si film. Also in these cases, the same effects as those of the above-described embodiments can be obtained.

(Chlorosilane-based gas→inert gas)×*n*→silane-based gas (Chlorosilane-based gas→inert gas→silicon hydride gas→inert gas)×*n*→silane-based gas (Chlorosilane-based gas→inert gas→H-containing gas→inert gas)×*n*→silane-based gas In the above-described embodiments, there has been described the case where the semiconductor element contained in each of the Cl-containing semiconductor layer and the semiconductor film includes Si. However, the semiconductor element contained in the Cl-containing semiconductor layer and the semiconductor film is not limited to Si, and may include at least one selected from the group of Si and germanium (Ge). That is, the Cl-containing semiconductor layer may include at least one selected from the group of a Cl-containing Si layer, a Cl-containing Ge layer, and a Cl-containing SiGe layer. In addition, the semiconductor film may include at least one selected from the group of a Si film, a Ge film, and a SiGe film. Also in these cases, the same effects as those of the above-described embodiment can be obtained.

In the above-described embodiments, there has been described the case where a series of steps from the formation of the Cl-containing Si layer to the annealing are performed in the same process chamber 201 (in-situ). However, the present disclosure is not limited to such an embodiment. For example, a series of steps from the formation of the Cl-containing Si layer to the formation of the Si film may be performed in the same process chamber, and then the annealing may be performed in another process chamber (ex-situ). Also in this case, the same effects as those of the above-described embodiment can be obtained.

Further, for example, another step (another film-forming step) of forming a film (silicon oxide film, silicon nitride film, etc.) other than the Si film may be performed between the formation of the Si film and the annealing. In this case, a series of steps from the formation of the Cl-containing Si layer to the annealing, that is, a series of steps including another film-forming step may be performed in the same process chamber (first process chamber). Further, a series of steps from the formation of the Cl-containing Si layer to the formation of the Si film may be performed in one and the same process chamber (first process chamber), and a series of steps from another film formation to the annealing may be performed in another process chamber (second process chamber). Moreover, a series of steps from the formation of the Cl-containing Si layer to the formation of the Si film may be performed in the same process chamber (first process chamber), another film formation step may be performed in another process chamber (second process chamber), and the annealing may be performed in a further process chamber (third process chamber) or in the first process chamber. Also in these cases, the same effects as those of the above-described embodiment can be obtained.

In the various cases described above, if a series of steps are performed in-situ, the wafer 200 is not exposed to the atmosphere during the process, and the wafer 200 can be consistently processed while being kept under vacuum. This makes it possible to perform stable substrate processing. In addition, if some steps are performed ex-situ, the temperature in each process chamber can be set in advance to, for example, a processing temperature required in each step or a temperature close thereto, thereby shortening the time required for temperature adjustment and enhancing the manufacturing efficiency.

In the above-described embodiment, there has been described the example in which the nozzles 249*a* to 249*c* are installed adjacent to each other. However, the present disclosure is not limited to such an embodiment. For example, the nozzles 249*a* and 249*c* may be installed at positions spaced apart from the nozzle 249*b* in the annular space between the inner wall of the reaction tube 203 and the wafer 200 in a plan view. Also in this case, the same effects as those of the above-described embodiment can be obtained.

It is desirable that the recipe used for substrate processing is prepared separately according to the processing contents and are stored in the memory device 121*c* via an electric communication line or an external memory device 123. When starting a process, it is desirable that the CPU 121*a* properly selects an appropriate recipe from a plurality of recipes stored in the memory device 121*c* according to the contents of the substrate processing. This makes it possible to form films of various film types, composition ratios, film qualities and film thicknesses with high reproducibility in one substrate processing apparatus. In addition, the burden on an operator can be reduced, and the process can be quickly started while avoiding operation errors.

The above-described recipes are not limited to the newly prepared ones, but may be prepared by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 provided in the existing substrate processing apparatus may be operated to directly change the existing recipes already installed in the substrate processing apparatus.

In the above-described embodiments, there has been described an example in which a film is formed using a batch type substrate processing apparatus for processing a plurality of substrates at a time. The present disclosure is not limited to the above-described embodiment, but may be suitably applied to, for example, a case where a film is formed using a single-wafer type substrate processing apparatus for processing one or several substrates at a time. Furthermore, in the above-described embodiment, there has been described an example in which a film is formed using a substrate processing apparatus having a hot wall type process furnace. The present disclosure is not limited to the above-described embodiment but may also be suitably applied to a case where a film is formed using a substrate processing apparatus having a cold wall type process furnace.

Even when these substrate processing apparatuses are used, the film formation can be performed under the same sequences and processing conditions as those of the above-described embodiment and modifications. Effects similar to those of the above-described embodiment and modifications may be obtained.

In addition, the above-described embodiments and modifications may be used in combination as appropriate. The processing procedure and processing conditions at this time may be, for example, the same as the processing procedures and processing conditions of the above-described embodiment.

EXAMPLES

Using the substrate processing apparatus shown in FIG. 1, according to the substrate processing sequence shown in FIG. 4, a Cl-containing Si layer and a Si film were formed in the named order on a SiO film provided on the surface of a wafer to prepare an evaluation sample. The processing procedure and processing condition in each step are the same as the processing procedure and processing condition in each step of the above-described embodiments. A plurality of evaluation samples was prepared by changing the Cl concentration in the Cl-containing Si layer. Then, the dangling bond density in each evaluation sample was measured.

Figure 5:
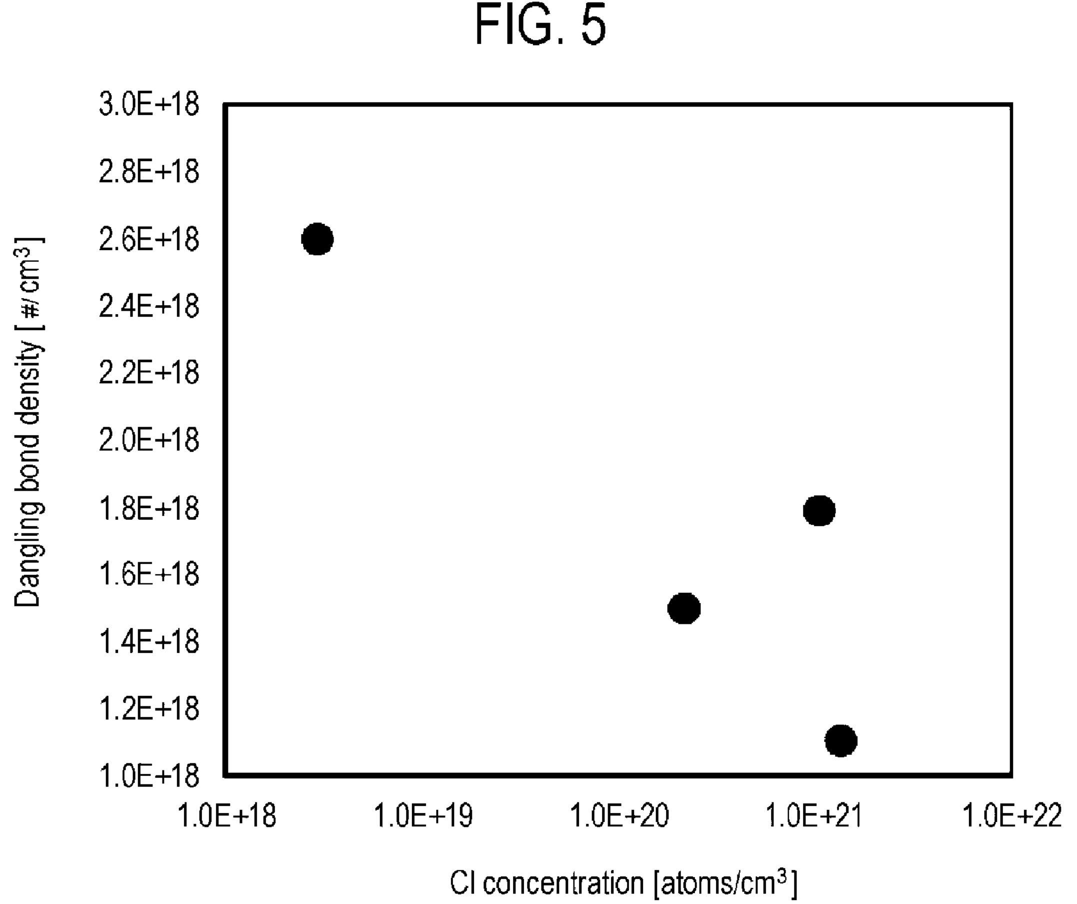
FIG. 5 is a plot diagram showing a relationship between a chlorine concentration and a dangling bond density in an example of embodiments of the present disclosure.

FIG. 5 shows the relationship between the Cl concentration and the dangling bond density at the interface between the Si film and the SiO film (hereinafter referred to as Si/SiO interface) for each evaluation sample, that is, the Cl concentration dependency of the dangling bond density at the Si/SiO interface. The horizontal axis in FIG. 5 indicates the Cl concentration [atoms/$cm^3$] at the Si/SiO interface, and the vertical axis indicates the dangling bond density [#/$cm^3$] at the Si/SiO interface. ● marks in FIG. 5 indicate plots of the measured values of the dangling bond density in each evaluation sample.

From FIG. 5, it can be seen that the higher the Cl concentration at the Si/SiO interface, the lower the dangling bond density. In particular, by making the Cl concentration at the Si/SiO interface $1.0\times10^{20}$ atoms/$cm^3$ or more, specifically $3.0\times10^{20}$ atoms/$cm^3$ or more, it is possible to significantly reduce the dangling bond density.

According to the present disclosure in some embodiments, it is possible to improve the characteristics of a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A method of processing a substrate, comprising:

(a) forming a chlorine-containing semiconductor layer on an insulating film provided on a surface of the substrate by supplying a first gas containing a semiconductor element and chlorine to the substrate; and (b) forming a semiconductor film on the chlorine-containing semiconductor layer by supplying a second gas containing a semiconductor element to the substrate, wherein a chlorine concentration in the chlorine-containing semiconductor layer formed in (a) is made $1.0\times10^{20}$ atoms/$cm^3$ or more and $1.0\times10^{22}$ atoms/$cm^3$ or or less, wherein the chlorine-containing semiconductor layer constitutes an interface between the insulating film and the semiconductor film, and wherein each of the insulating film and the semiconductor film is chlorine-free.

2. The method of claim 1, wherein the chlorine concentration in the chlorine-containing semiconductor layer formed in (a) is made $3.0\times10^{20}$ atoms/$cm^3$ or more and $5.0\times10^{21}$ atoms/$cm^3$ or less.

3. The method of claim 1, wherein a thickness of the chlorine-containing semiconductor layer formed in (a) is made 1 monolayer or more and 30 Å or less.

4. The method of claim 1, wherein a thickness of the chlorine-containing semiconductor layer formed in (a) is made 2.5 Å or more and 30 Å or less.

5. The method of claim 1, wherein a thickness of the chlorine-containing semiconductor layer formed in (a) is made 3 Å or more and 20 Å or less.

6. The method of claim 1, wherein in (a), a cycle is performed a predetermined number of times, the cycle including non-simultaneously performing:

(a1) supplying the first gas to the substrate; and (a2) removing the first gas remaining in a space where the substrate exists.

7. The method of claim 1, wherein in (a), a cycle is performed a predetermined number of times, the cycle including non-simultaneously performing:

(a1) supplying the first gas to the substrate;

(a2) removing the first gas remaining in a space where the substrate exists;

(a3) supplying a third gas containing a semiconductor element and hydrogen to the substrate; and (a4) removing the third gas remaining in the space where the substrate exists.

8. The method of claim 6, wherein a chlorine concentration at an interface between the insulating film and the semiconductor film is controlled by one or more selected from the group of a temperature of the substrate, a pressure in the space where the substrate exists, a supply flow rate of the first gas, and a supply time of the first gas in (a).

9. The method of claim 6, wherein a chlorine concentration at an interface between the insulating film and the semiconductor film is controlled by the number of times the cycle is performed in (a).

10. The method of claim 6, wherein a dangling bond density at an interface between the insulating film and the semiconductor film is controlled by one or more selected from the group of a temperature of the substrate, a pressure in the space where the substrate exists, a supply flow rate of the first gas, and a supply time of the first gas in (a).

11. The method of claim 6, wherein a dangling bond density at an interface between the insulating film and the semiconductor film is controlled by the number of times the cycle is performed in (a).

12. The method of claim 1, wherein a thickness of the chlorine-containing semiconductor layer is smaller than a thickness of each of the insulating film and the semiconductor film.

13. The method of claim 1, wherein the semiconductor element includes at least one selected from the group of silicon and germanium.

14. The method of claim 1, wherein the chlorine-containing semiconductor layer includes at least one selected from the group of a chlorine-containing silicon layer, a chlorine-containing germanium layer, and a chlorine-containing silicon germanium layer, and wherein the semiconductor film includes at least one selected from the group of a silicon film, a germanium film, and a silicon germanium film.

15. The method of claim 1, further comprising:

(c) annealing the substrate after the semiconductor film is formed on the chlorine-containing semiconductor layer.

16. The method of claim 15, wherein in the annealing, the chlorine-containing semiconductor layer and the semiconductor film are crystallized.

17. A method of manufacturing a semiconductor device, comprising the method of claim 1.

* * * * *